United States Patent
Lourdudoss et al.

(10) Patent No.: US 8,299,502 B2
(45) Date of Patent: Oct. 30, 2012

(54) SEMICONDUCTOR HETEROSTRUCTURES AND MANUFACTURING THEROF

(76) Inventors: Sebastian Lourdudoss, Taby (SE); Fredrik Olsson, Tullinge (SE)

( * ) Notice: Subject to any disclaimer, the term of this patent is extended or adjusted under 35 U.S.C. 154(b) by 429 days.

(21) Appl. No.: 12/531,632

(22) PCT Filed: Mar. 14, 2008

(86) PCT No.: PCT/SE2008/050288
§ 371 (c)(1), (2), (4) Date: Sep. 16, 2009

(87) PCT Pub. No.: WO2008/115135
PCT Pub. Date: Sep. 25, 2008

(65) Prior Publication Data
US 2010/0072513 A1 Mar. 25, 2010

Related U.S. Application Data

(60) Provisional application No. 60/918,371, filed on Mar. 16, 2007.

(51) Int. Cl.
*H01L 29/02* (2006.01)
*H01L 21/20* (2006.01)

(52) U.S. Cl. .................. 257/200; 257/183; 438/478

(58) Field of Classification Search .......... 257/183, 257/200, 201, E29.002, E21.09; 438/478
See application file for complete search history.

(56) References Cited

U.S. PATENT DOCUMENTS

| | | | | |
|---|---|---|---|---|
| 4,522,661 A | * | 6/1985 | Morrison et al. | 148/33.2 |
| 5,389,571 A | * | 2/1995 | Takeuchi et al. | 117/89 |
| 6,225,650 B1 | * | 5/2001 | Tadatomo et al. | 257/190 |
| 6,255,198 B1 | * | 7/2001 | Linthicum et al. | 438/481 |
| 6,294,440 B1 | * | 9/2001 | Tsuda et al. | 438/479 |
| 6,335,546 B1 | * | 1/2002 | Tsuda et al. | 257/94 |
| 6,380,108 B1 | * | 4/2002 | Linthicum et al. | 438/791 |
| 6,468,882 B2 | * | 10/2002 | Motoki et al. | 438/460 |
| 6,627,974 B2 | * | 9/2003 | Kozaki et al. | 257/623 |
| 6,693,021 B1 | * | 2/2004 | Motoki et al. | 438/481 |
| 6,756,611 B2 | * | 6/2004 | Kiyoku et al. | 257/103 |
| 6,861,729 B2 | * | 3/2005 | Kozaki et al. | 257/623 |
| 7,083,679 B2 | * | 8/2006 | Kiyoku et al. | 117/101 |

(Continued)

FOREIGN PATENT DOCUMENTS

EP 1263031 A1 12/2002

(Continued)

OTHER PUBLICATIONS

European Search Report, dated Feb. 15, 2011, in Application EP 08724235.

(Continued)

*Primary Examiner* — Ha Tran T Nguyen
*Assistant Examiner* — Jordan Klein
(74) *Attorney, Agent, or Firm* — Young & Thompson

(57) ABSTRACT

A semiconductor heterostructure (10) includes a crystalline substrate of a first semiconductor material and a mask (11) disposed over a surface of the crystalline substrate. The mask (11) has openings (12) including a plurality of elongated opening sections (13, 14) with a width (w) less than or equal to 900 nm. At least one first section (13) of the elongated opening sections is directed non-parallel relative to at least one second section (14) of the elongated opening sections. The semiconductor heterostructure (10) further includes an overgrowth crystalline layer of a second semiconductor material, filling the openings (12) and covering the mask. A method for manufacturing of such a semiconductor heterostructure is also presented.

18 Claims, 5 Drawing Sheets

U.S. PATENT DOCUMENTS

| | | | |
|---|---|---|---|
| 2001/0003019 A1* | 6/2001 | Morita | 428/195 |
| 2002/0066403 A1* | 6/2002 | Sunakawa et al. | 117/84 |
| 2002/0111044 A1* | 8/2002 | Linthicum et al. | 438/797 |
| 2003/0092230 A1* | 5/2003 | Koike et al. | 438/200 |
| 2006/0099781 A1* | 5/2006 | Beaumont et al. | 438/509 |
| 2006/0172512 A1* | 8/2006 | Hiramatsu et al. | 438/483 |
| 2006/0266281 A1* | 11/2006 | Beaumont et al. | 117/84 |
| 2006/0276043 A1* | 12/2006 | Johnson et al. | 438/717 |
| 2007/0029643 A1* | 2/2007 | Johnson et al. | 257/651 |

FOREIGN PATENT DOCUMENTS

| | | |
|---|---|---|
| JP | 11-043398 A | 2/1999 |
| JP | 11043398 A * | 2/1999 |
| JP | 2004-273661 A | 9/2004 |
| WO | 0147002 A2 | 6/2001 |
| WO | 2004086461 A2 | 10/2004 |
| WO | 2006035212 | 4/2006 |
| WO | 2006125040 | 11/2006 |

OTHER PUBLICATIONS

International Search Report dated Jun. 19, 2008, in PCT application.

English translation of Japanese Office Action, dated Feb. 21, 2012, from corresponding Application No. JP2009-553550.

* cited by examiner

SEMICONDUCTOR HETEROSTRUCTURES AND MANUFACTURING THEROF

TECHNICAL FIELD

The present invention relates to semiconductor heterostructures and manufacturing thereof.

BACKGROUND

Semiconductor compounds or alloys consisting of column III and column V materials often have important electrical and/or optical properties due to the shape of its energy bands. Many of them, like InP and related compounds, GaAs and related compounds and GaN and related compounds are direct bandgap semiconductors, which have, depending upon the material, a wide emission spectrum range from far infrared to ultraviolet and are applied to different optical components such as light-emitting diodes (LEDs), laser diodes (LDs), modulators and detectors. Besides, owing to their high carrier mobilities, and high saturation velocities, they are also highly suitable for electronic components. Silicon has poor optical properties due to its indirect bandgap, but silicon is in widespread use in the whole electronics industry because of several reasons. It has rather good electrical and mechanical properties, it has a matured manufacturing technology, their wafer size is large and it is comparatively cheap. In order to take advantage of both silicon and III-V semiconductors, it is important to combine these two materials.

It is possible by conventional epitaxial techniques like MOVPE, MBE or any other related technique, to deposit III-V materials on silicon to form a seed layer. However, these seed layers will still contain a high density of dislocations due to a relatively large lattice mismatch between the deposited materials and silicon. A general method has been to use epitaxial lateral overgrowth (ELO) to filter off these dislocations but so far the openings of the mask used in this process have been on the order of micrometers. Most such processes did not effectively avoid the dislocation propagation from the seed layer into the grown layer just above the openings. As a result, the layer grown above the masked region was non-homogenous in dislocation density: it contained very large dislocation density above the openings compared to the ELO layer, which is above the mask.

One example is found in the published US patent application 2002/0066403. Here, group III-V compound semiconductor layers were grown on a substrate starting from growing areas produced using a patterned mask. Facet structures from the different growing areas were allowed to grow together and formed a relatively a thick covering layer. Here the dislocations followed the facets and were thereby somewhat reduced. However, the grown layers were relatively thick and dislocations were still found in the areas where the different facets met.

In the published International patent application WO 2006/125040, semiconductor heterostructures and methods for fabrication were presented. Masks with openings were positioned over the substrate in such an orientation that threading dislocations were decreased during growth within the openings. Narrow and relatively deep openings were to prefer, preferable directed in 45° relative to a crystallographic direction of the substrate. However, a disadvantage was that severe lattice imperfections occur when different overgrowth areas meet.

SUMMARY

An object of the present invention is to provide semiconductor heterostructures having a low, generally homogeneous, dislocation density. A further object is to provide such semiconductor heterostructures having a thin overgrowth layer thickness.

The above objects are achieved by the methods and devices according to the enclosed patent claims. In general, according to a first aspect, a semiconductor heterostructure comprises a crystalline substrate of a first semiconductor material and a mask disposed over a surface of the crystalline substrate. The mask has openings comprising a plurality of elongated opening sections with a width less than or equal to 900 nm. At least one first section of the elongated opening sections is directed non-parallel relative to at least one second section of the elongated opening sections. The semiconductor heterostructure further comprises an overgrowth crystalline layer of a second semiconductor material, filling the openings and covering the mask.

According to a second aspect, a method for manufacturing of a semiconductor heterostructure comprises providing of a crystalline substrate of a first semiconductor material and disposing of a mask over a surface of said crystalline substrate. Openings in the mask are created. The openings comprise a plurality of elongated opening sections with a width less than or equal to 900 nm. At least one first section of the elongated opening sections being directed non-parallel relative to at least one second section of the elongated opening sections. An overgrowth crystalline layer of a second semiconductor material is grown, filling the openings and covering the mask.

An advantage of the present invention is that nearly a dislocation free homogenous semiconductor layers of a heterostructure is accomplished, where the layer thickness can be as thin as 2 $\mu$m.

BRIEF DESCRIPTION OF THE DRAWINGS

The invention, together with further objects and advantages thereof, may best be understood by making reference to the following description taken together with the accompanying drawings, in which.

DETAILED DESCRIPTION

Throughout the drawings, the same reference numbers are used for similar or corresponding elements.

The present invention relates to semiconductor material grown on a substrate of another material. The invention relates to a method which utilizes epitaxial lateral overgrowth (ELO) originating from small openings.

The illustrated embodiments relates to III/V semiconductor materials, such as InP, GaAs, GaN and their related compounds grown on silicon. In particular, InP has been most thoroughly investigated. However, also other material combinations are possible. Examples of possible substrates include, but not exclusively, the following: Si, SOI (Silicon on Insulator), Sapphire, SiC, GaAs and InP. The grown material is different from the substrate and examples include, but not exclusively, the following: InP, GaAs, GaN, SiC and their related compounds.

A semiconductor heterostructure according to the invention comprises a crystalline substrate of a first semiconductor material. A mask is disposed over a surface of the crystalline substrate. The mask has openings in which an overgrowth can be initiated on the underlying surface. The openings comprise a plurality of elongated opening sections with a width less than or equal to 900 nm. At least one first section of the elongated opening sections is directed non-parallel relative to at least one second section of the elongated opening sections. The edges of the opening sections thereby face each other in a non-zero angle. An overgrowth crystalline layer of a second semiconductor material fills the openings and covers the mask.

Figure 1:
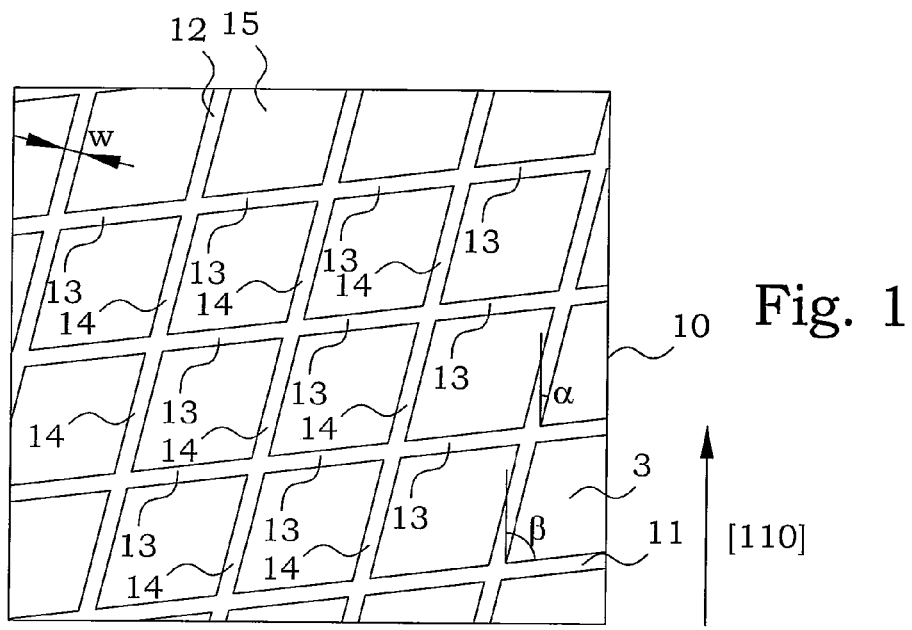
FIG. 1 is an illustration of a mask geometry according to an embodiment of the present invention.

FIG. 1 illustrates a top view of an embodiment of such a heterostructure 10 before the second semiconductor material is provided. A mask 3 covers most of the area, but narrow openings 11 are provided in a mesh structure 12. The mask 3 material may be silicon dioxide or silicon nitride or any other suitable inert material. The mesh structure 12 comprises elongated opening sections 13, 14, in this embodiment directed in two different directions. The width w of the opening structure is smaller or equal to 900 nm, e.g. 100 nm or 500 nm, and most preferably smaller than 100 nm. A first group of opening sections 13 are positioned almost horizontally in the figure, while a second group of opening sections 14 are positioned almost vertically in the figure. In this embodiment, the substrate is the (001) surface of Si, and the direction is indicated in the figure. The surface can typically be (001) or 2-8° misoriented toward <111> or <110>. The direction of the first group of opening sections 13 are thereby positioned with an angle β relative the substrate [110] direction and that of the second group of opening sections 14 are thereby positioned with an angle α relative the substrate [110] direction. Preferably, these angles differ from <100> and <110>. At a general substrate surface, the angles are non-zero and non-perpendicular and preferably also differ from any other symmetry plane of the substrate surface. In other words, a longitudinal direction of one or both of the differently oriented opening sections is directed in non-zero angles with respect to main crystal axes of the surface of said crystalline substrate. Furthermore, the longitudinal direction is preferably also directed in a non-zero angle with respect to all symmetry planes of the surface of said crystalline substrate. The deviation is preferably larger than about 5°. Preferably, the angle β-α is larger than 5° and less than 175°. The tilts α and β of the lines in line patterns in FIG. 1 have been tested for different combinations, 15° and 60°, 15° and 75°, 15° and 105°, 15° and 120°, 30° and 60°, 30° and 75°, 30° and 105° and 30° and 120°, respectively. All these angles are defined with respect to the [011] direction of the silicon wafer.

The elongated opening sections in FIG. 1 are formed as crossing linear opening sections. However, the opening may also be provided in other geometrical configurations. One example is that the elongated opening sections are circular arc sections, which together e.g. may form ring structured openings or general curved sections. These circular or curved sections may also as illustrated further below form concentric ring openings or spiral shaped openings. The opening width in all the cases is as before preferably less than 900 nm.

Threading dislocations that exit after growth initiation in the mask openings, e.g. in a seed layer, see further below, propagate in the vertical direction through the openings. However in the regions 15 above the mask 3 where the material is grown laterally, such a propagation is hindered, i.e. these dislocations are filtered. However, for sufficiently small openings there is also a filtering of these dislocations due to the nano-size of the openings and hence nearly a dislocation free region even above the openings is obtained. As a consequence this results in a homogenous and nearly dislocation free layer both above the openings and on top of the mask. The present invention thus provides methods to deposit semiconductors, e.g. III-V semiconductors, of high crystallinity on a substrate, e.g. silicon.

Figure 2:
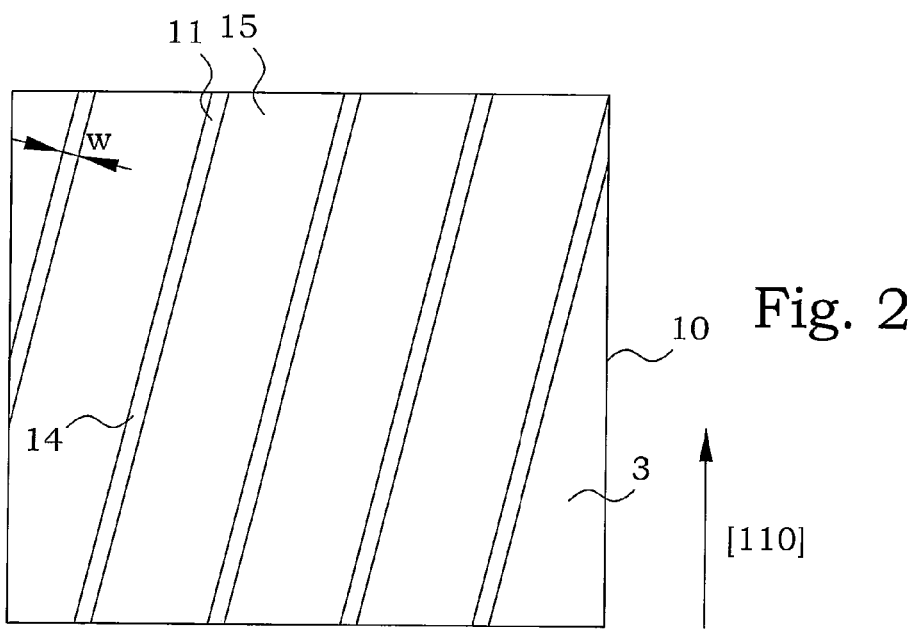
FIG. 2 is an illustration of another mask geometry.

The provision of narrow openings directed in differing direction further improves the quality of the deposited semiconductors. If overgrowth in the regions 15 above the mask is performed, initiated from only parallel openings, such as e.g. illustrated in FIG. 2, the overgrowth from the opposing directions will meet essentially at the same time along an extended distance typically half way between the openings, a coalescence region. In such a situation, it is probable that a large amount of crystallinity defects are produced at the coalescence region. However, starting the overgrowth from non-parallel openings will instead successively create a moving boundary between the merging overgrowth portions. The active part of the coalescence region will move over the mask surface during a certain time, which provides for the overgrowth to relax any crystallinity defects in a best way and thereby minimize the defect density at the coalescence region.

Figure 3:
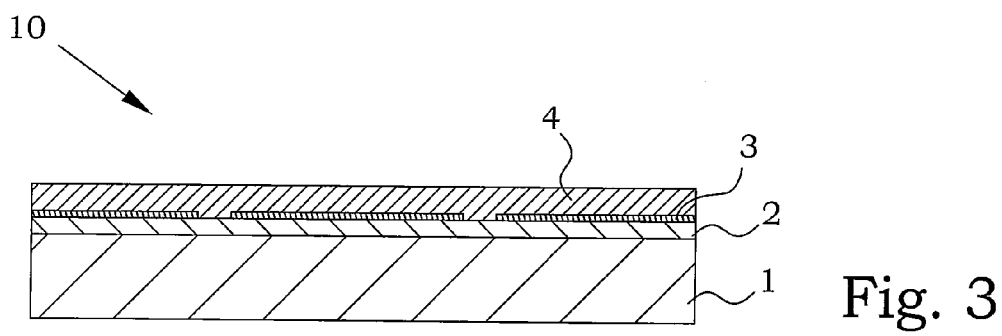
FIG. 3 is a cross-sectional view of an embodiment of a heterostructure according to the present invention.

An embodiment of the invention relates to a method utilizing a seed layer, which is provided on top of the substrate surface, for example silicon, before the mask is provided. Such an embodiment is illustrated in cross section in FIG. 3. A seed layer 2, in this embodiment of InP, is grown on a substrate 1, in this embodiment silicon. The pre-deposited InP seed layer 2 has a thickness of 1.0-1.5 µm thickness and comprises typically a high density of threading dislocations due to the large mismatch between InP and Si. On top of the seed layer, the patterned mask 3, in this embodiment of SiO$_2$, is provided. The patterned mask comprised in this embodiment 40 nm thick SiO$_2$. Finally a semiconductor overlayer 4, in this embodiment of InP, is grown on top of the mask according to the principles described above, utilizing hydride vapour phase epitaxy. This embodiment thus utilizes epitaxial lateral overgrowth (ELO) from the small openings created by dielectric materials on a proper seed layer 2 grown on the substrate surface 1. As mentioned above the width of the openings is to be of dimension not exceeding 900 nm. These width dimensions are effective in filtering off dislocations in the seed layer from propagating to the grown layer both above the masked areas (ELO layer) as well as that above the openings.

The narrow openings together with the orientation of the openings make it possible to achieve good crystallinity even in very thin overgrown layers, even below 2 µm. The thickness of the layer grown by our methods is comparable to that of the seed layer thereby making the total distance between the silicon surface and the overgrown semiconductor surface minimal. Embodiments of the present invention thus describe methods to accomplish a nearly dislocation free homogenous III-V semiconductor layer of thickness less than 2 µm not only above the mask but also above the openings. The dislocation density is drastically reduced throughout the grown layer.

Figure 4:
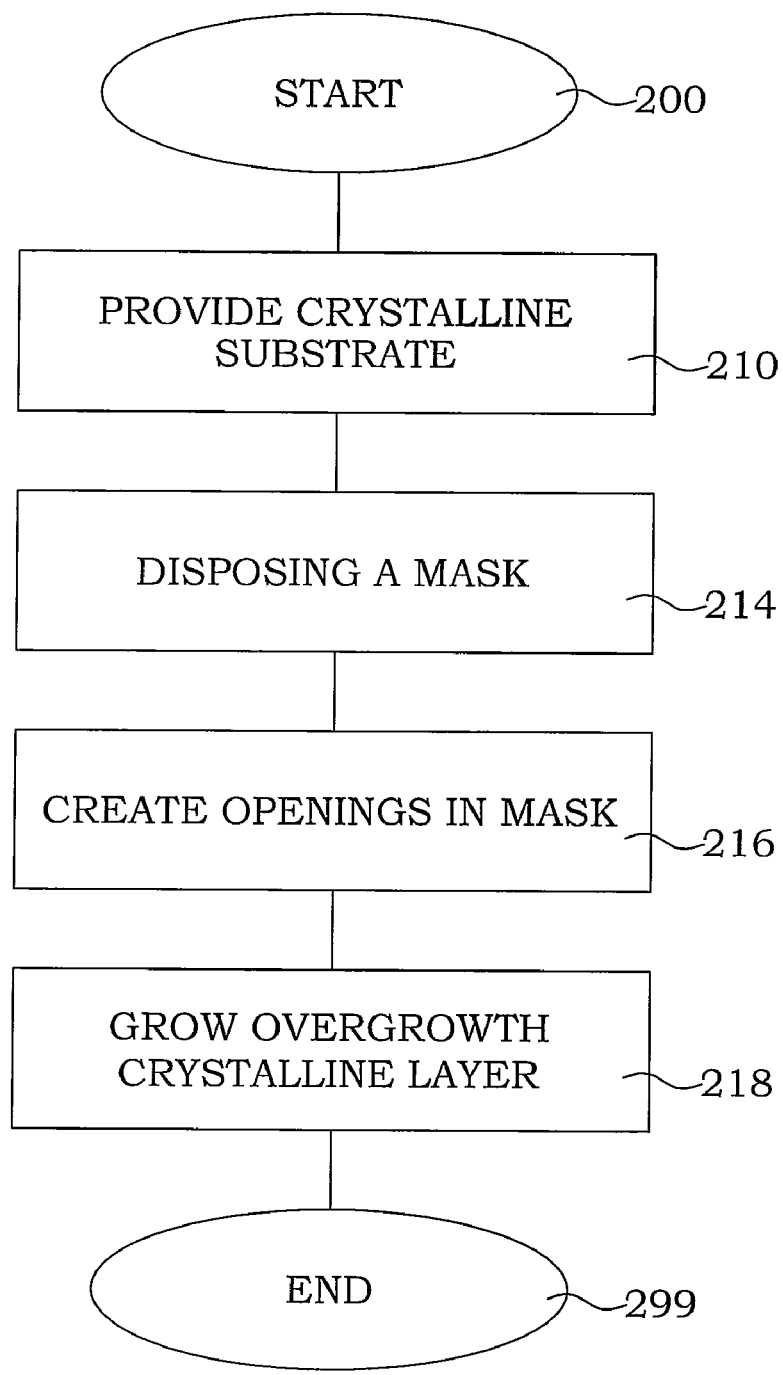
FIG. 4 is a flow diagram of steps of an embodiment of a method according to the present invention.

FIG. 4 illustrates a flow diagram of steps of an embodiment of a method according to the present invention. The method for manufacturing of a semiconductor heterostructure begins in step 200. In step 210, a crystalline substrate of a first semiconductor material is provided. A mask is disposed over a surface of the crystalline substrate in step 214. Openings in the mask are created in step 216. The openings comprise a plurality of elongated opening sections with a width less than or equal to 900 nm. At least one first section of the elongated opening sections being directed non-parallel relative to at least one second section of the elongated opening sections. The patterns of openings on the masking material are in the present embodiment created by a lithographic method or imprinting method with subsequent etching of the masking layer to form nano-scale size opening. In step 218, an overgrowth crystalline layer of a second semiconductor material is grown. The overgrowth crystalline layer fills the openings and covers the mask. Preferably, the overgrowth is ended while the overgrowth crystalline layer has a thickness of less than 2 μm above the mask. The procedure ends in step 299.

Figure 5:
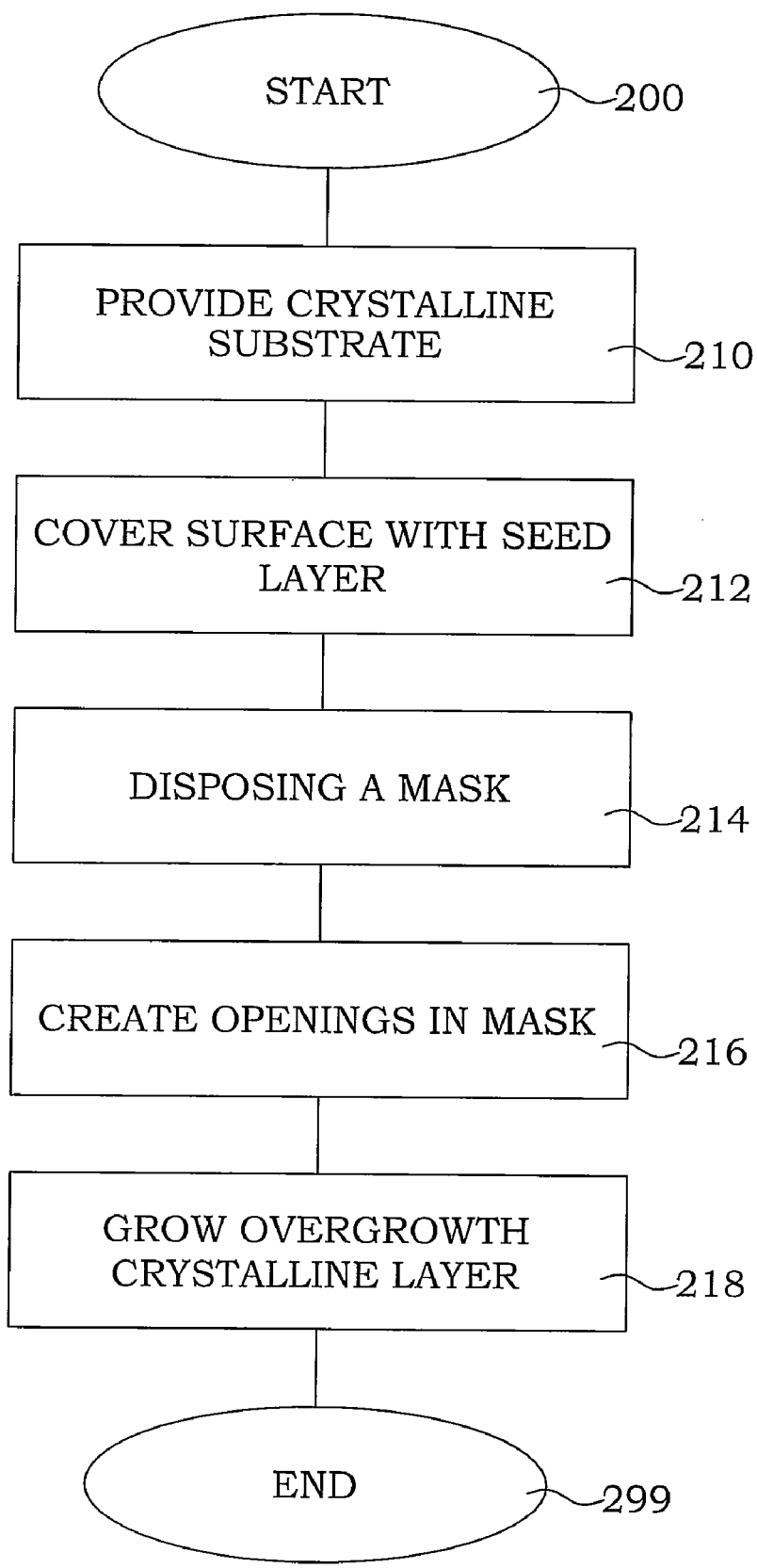
FIG. 5 is a flow diagram of steps of another embodiment of a method according to the present invention.

FIG. 5 illustrates a flow diagram of steps of another embodiment of a method according to the present invention. The embodiment comprises the additional step 212 of covering the surface of the crystalline substrate with a seed layer before the step 214 of disposing the mask. The method according to this embodiment of the invention comprises several steps to achieve a homogeneous layer of low dislocation density on top of silicon provided with seed layers and mask openings. The masking material such as silicon dioxide or silicon nitride or any other suitable inert material is deposited by a low temperature process on the seed layer provided on silicon. The openings expose the seed layer whereas the unopened part of the mask material conceals the seed layer. A semiconductor material, which has a lattice constant not very different from that of the seed layer, is then grown, using the exposed openings as the seed for further growth. As soon as the layer thickness exceeds that of the mask, the growth originating from the openings takes place also laterally on the mask.

A particular embodiment of a process for manufacturing InP on Silicon with a seed layer will here be presented.

Firstly, a mask material of silicon dioxide ($SiO_2$) of about 40 nm is deposited by plasma enhanced chemical vapour deposition (PE-CVD) on top of a 1.0-1.5 μm thick seed layer on (001) Si substrate with 4° misorientation toward <111>. Other substrate surfaces can be utilized in other embodiments, as mentioned further above. An electron beam resist of polymethylmethacrylate (PMMA) was spin coated on top of the $SiO_2$ and the pattern was formed by means of electron beam lithography and a subsequent reactive ion beam etch (RIBE) using trifluoromethane ($CHF_3$) as an etching gas. The patterns consist of various meshes, contained in a field of size 40×40 μm². This size was used in this particular example, but in other embodiments, the size of the field can be much larger, mainly depending on the final application. Also smaller sizes can be used if the application so requires.

Secondly, the sample with the patterned seed layer was thoroughly cleaned by the following procedure: (i) degrease the patterned wafer by dipping it in acetone for about 1 minute; (ii) rinse it in iso-propanol twice for about 30 seconds each time; (iii) rinse it three times in de-ionized water; (iv) clean it in a commercial solution, Semicoclean® for about two minutes; (v) rinse it three times in de-ionized water; (vi) clean it in concentrated sulphuric acid ($H_2SO_4$) for about 1 minute; (vii) rinse three times in de-ionized water; (viii) clean it again in Semicoclean® for about 2 minutes; (ix) rinse it three times in de-ionized water; (x) dip it in iso-propanol; (xi) take it out and blow dry with nitrogen gas.

Then an indium phosphide layer of thickness of about 1.5 μm is deposited on the patterns by means of hydride vapour phase epitaxy (HVPE) growth technique. The gaseous precursors in this process are indium chlorides (in-situ generated by means of hydrogen chloride (HCl) and molten indium) and phosphine ($PH_3$). The carrier gas is hydrogen ($H_2$) and nitrogen ($N_2$).

The cleaned patterned sample is ready for conducting growth of III-V semiconductors. It is loaded in the loading chamber on a susceptor. Then it is transferred automatically from the loading chamber to the deposition chamber. The pressure is decreased to 20 mbar and the sample is heated up in the reactor to reach a temperature of approximately 615° C. The whole procedure takes about 10 minutes and is done in a nitrogen environment with a small stabilization flow of 10 sccm $PH_3$. When the temperature has reached 590° C. the full flow of 120 sccm of $PH_3$ and 12 sccm of HCl is started. The HCl will flow through a melt of liquid indium contained in the reactor but held at a higher temperature of 730° C. A flow of approximately 12 sccm of InCl is generated in-situ. The total flow is 900 sccm where 45 sccm is $H_2$ and 723 sccm is $N_2$. The growth starts by opening a shutter above the susceptor. The conducted growth was done during 2 minutes and 15 seconds. After growth the pressure is increased to atmospheric pressure and the sample is subsequently moved back to the loading chamber where it is cooled down.

The openings in the masking layer serves as a nucleus for the growth of InP. InP will start to grow laterally as soon as its height exceeds that of $SiO_2$. The dislocations will be filtered off in the regions of lateral growth and on those above the small openings even though the growth here is in the vertical direction. The coalescence regions, where the growth from different openings will meet, have very few defects when choosing appropriate line directions as 15° and 105°, 15° and 120°. An excellent crystalline area can from this method be formed over large areas with a homogeneous quality not only above the mask but also above the openings. By this method, the thickness of the overgrown layer of good crystalline quality can be less than 2 μm.

Although InP deposition on silicon substrate is used in the above detailed example, the method is applicable to deposit any semiconductor with good crystallinity on silicon or any other suitable substrate. This method is thereby applicable to deposit any arbitrary crystalline semiconductor material on a different crystalline substrate. The substrate may form a template for depositing a layer of dissimilar semiconductor material where either natural substrate of the latter material is missing or its size is limited. Thus, the method we propose is generic to produce large area wafers of one particular material, e.g. InP, GaN, GaAs, AlN, ZnO etc. and their related compounds on the substrate of a dissimilar material (e.g., silicon).

Although the seed layer was InP any other semiconductor material which is lattice matched or closely lattice matched to the layer that is to be grown, e.g., $In_{1-x}Ga_xAs_yP_{1-y}$ (x=0.47y, $0 \leq y \leq 1$) can be used as the seed layer. The seed layer does not have to be necessarily a single layer but can also be composed of multiple layers.

Although the openings size here was 100 nm or 500 nm, any other opening in the interval 0<opening<900 nm may be used, e.g. 50, 100, 200, 300, 400, 500, 600, 700, 800 or 900 nm. Preferably, openings having widths below 100 nm are used. The filtering effect within the opening area and the overall quality becomes better for smaller openings. Further, the used line directions in the mesh pattern were here set to 15°, 30°, 60°, 75°, 105° and 120° with respect to [011] direction of silicon. But any line direction with opening size mentioned above combined with appropriate growth conditions leading to an appreciable lateral growth rate can be used.

Although dry etching was used in conjunction with lithography, wet etching can also be used in any of the steps.

Although the growth was conducted at a low pressure and at 615° the growth can be done at another pressure or at another temperature. The used flows are chosen so as to maximize the obtained material quality, but other flows may be used, as well as any dopant bearing gas (e.g., $H_2S$). Additionally, the growth method used here was a near equilibrium process, HVPE, which therefore gives a high selective growth with no direct nucleation on the used mask, $SiO_2$, but other epitaxial growth methods may be used as well, such as Metal-Organic Vapour Phase Epitaxy (MOVPE), Liquid Phase Epitaxy (LPE) or Molecular Beam Epitaxy (MBE), atomic layer epitaxy (ALE) and the variations of all these techniques. The masking material was here $SiO_2$ but other masking materials may as well be used, such as silicon nitride $SiN_x$ or any other inert material or even metals.

This invention has been described according to the methods which have been used and what seem to be the most convenient and best way to filter off the dislocations, in the normally known method of epitaxial lateral overgrowth, not only above the mask but also above the openings.

Figure 6:
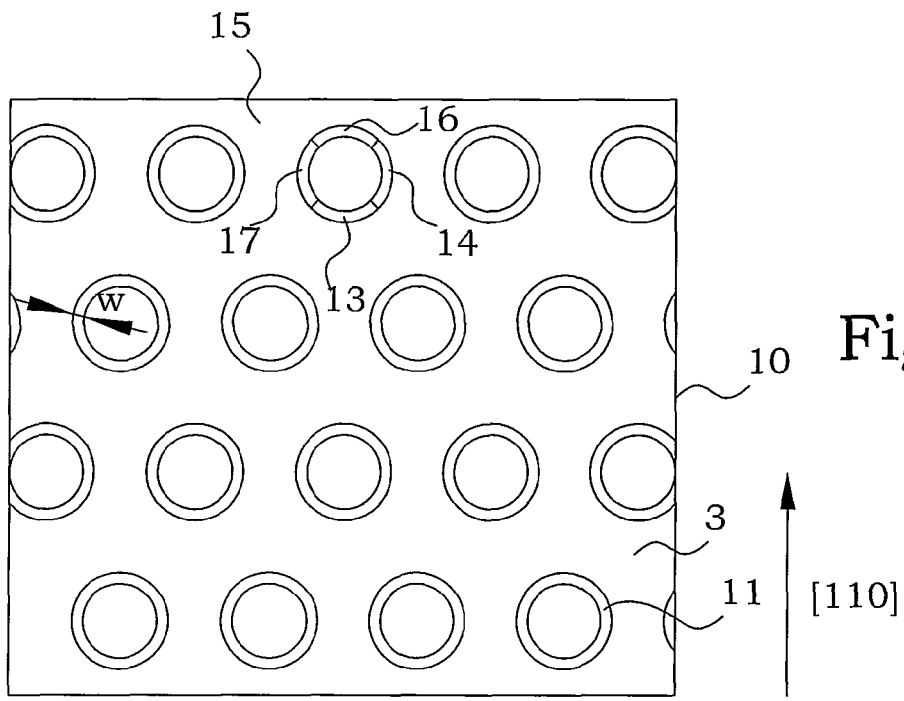
FIGS. 6-9 are illustrations of mask geometries according to other embodiments of the present invention.
Figure 7:
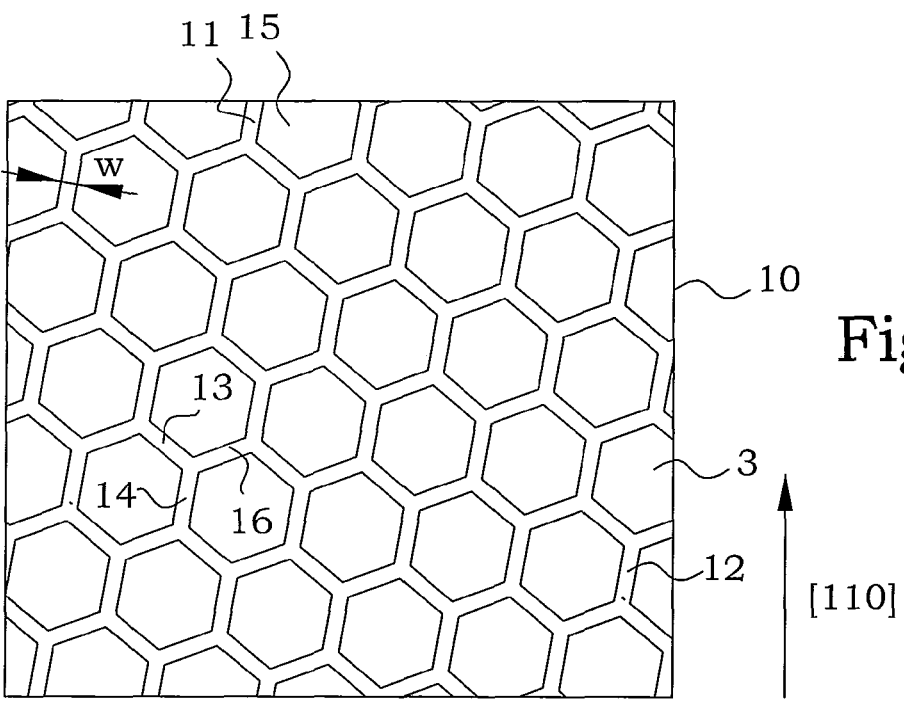
Figure 8:
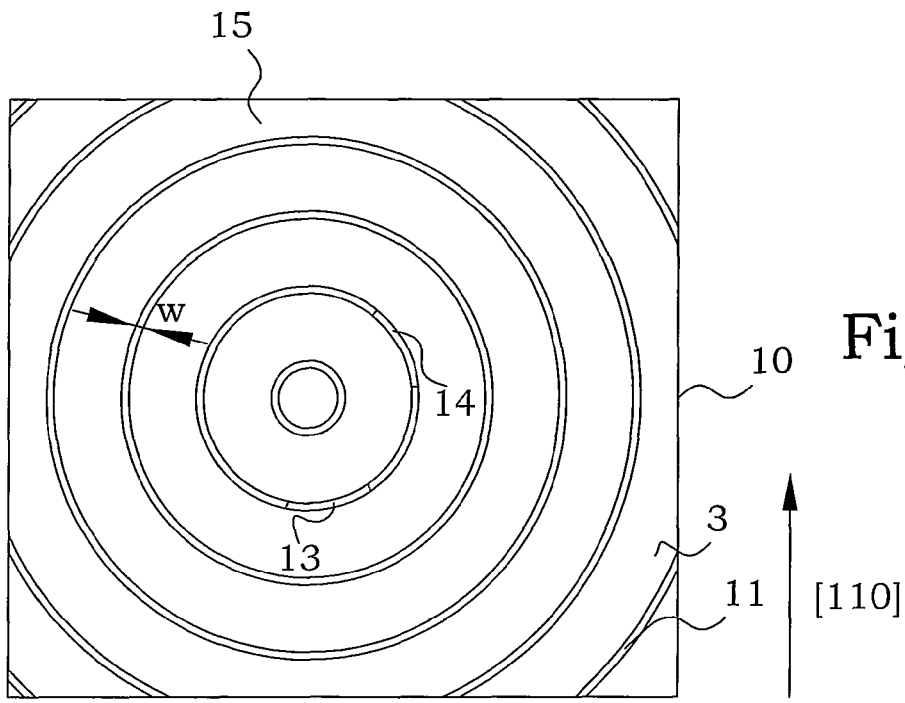
Figure 9:
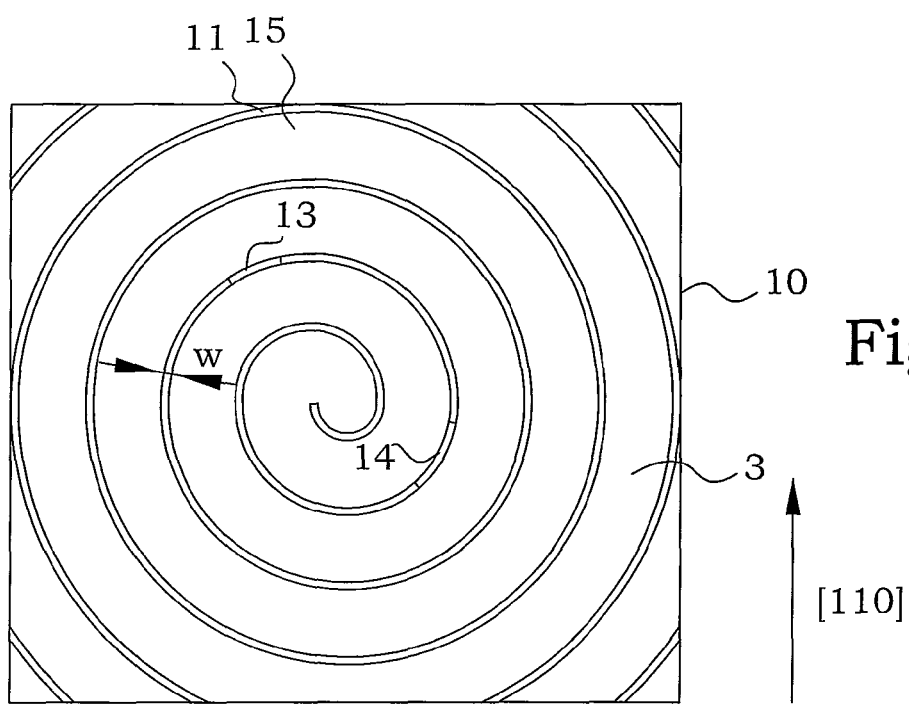

FIGS. 6 to 9 illustrate four other embodiments of mask geometries according to the present invention. FIG. 6 illustrates the previously mentioned ring-formed concept, where portions of the rings, i.e. are circular arc sections 13, 14, 16, 17 constitutes the elongated opening sections. FIG. 7 illustrates a mask structure with hexagonal symmetry and three groups of elongated opening sections 13, 14, 16, directed in different directions with respect to each other. FIG. 8 illustrates a mask structure with concentric rings having circular arc sections 13, 14. FIG. 9 illustrates a mask structure in the shape of a spiral. Curved sections 13, 14 are oriented in different directions. Anyone skilled in the art realizes that there are numerous examples of possible mask designs.

The embodiments described above are to be understood as a few illustrative examples of the present invention. It will be understood by those skilled in the art that various modifications, combinations and changes may be made to the embodiments without departing from the scope of the present invention. In particular, different part solutions in the different embodiments can be combined in other configurations, where technically possible. The scope of the present invention is, however, defined by the appended claims.

The invention claimed is:

1. A semiconductor heterostructure, comprising:
a crystalline substrate of a first semiconductor material;
a mask disposed over a surface of said crystalline substrate, said mask having openings comprising a plurality of elongated opening sections; and
an overgrowth crystalline layer of a second semiconductor material, filling said openings and covering said mask, said second semiconductor material being InP, GaAs or a combination thereof;
wherein,
at least one first section of said elongated opening sections is directed non-parallel relative to at least one second section of said elongated opening sections,
said plurality of elongated opening sections have a width less than or equal to 500 nm,
said elongated opening sections are crossing linear opening sections,
a longitudinal direction of at least one of said first section and said second section is directed in non-zero angles with respect to both main crystal axes of said surface of said crystalline substrate, and
at least one of said non-zero angles with respect to both main crystal axes of said surface of said crystalline substrate and said non-zero angle with respect to all symmetry planes of said surface of said crystalline substrate is larger than 5°.

2. The semiconductor heterostructure according to claim 1, wherein said longitudinal direction of said at least one first section is directed in an angle larger than 5° and less than 85° relative to said longitudinal direction of said at least one second section.

3. The semiconductor heterostructure according to claim 1, further comprising a seed layer provided between said surface of said crystalline substrate and said mask.

4. The semiconductor heterostructure according to claim 1, wherein said overgrowth crystalline layer has a thickness of less than 2 μm above said mask.

5. The semiconductor heterostructure according to claim 1, wherein said elongated opening sections have a width less than or equal to 100 nm.

6. A semiconductor heterostructure, comprising:
a crystalline substrate of a first semiconductor material;
a mask disposed over a surface of said crystalline substrate, said mask having openings comprising a plurality of elongated opening sections; and
an overgrowth crystalline layer of a second semiconductor material, filling said openings and covering said mask, said second semiconductor material being InP, GaAs or a combination thereof;
wherein,
at least one first section of said elongated opening sections is directed non-parallel relative to at least one second section of said elongated opening sections,
said plurality of elongated opening sections have a width less than or equal to 500 nm,
said elongated opening sections are curved sections or circular arc sections, and
said openings form concentric rings or spirals.

7. The semiconductor heterostructure according to claim 6, further comprising a seed layer provided between said surface of said crystalline substrate and said mask.

8. The semiconductor heterostructure according to claim 6, wherein said overgrowth crystalline layer has a thickness of less than 2 μm above said mask.

9. The semiconductor heterostructure according to claim 6, wherein said elongated opening sections have a width less than or equal to 100 nm.

10. A method for manufacturing of a semiconductor heterostructure, comprising the steps of:
providing a crystalline substrate of a first semiconductor material;
disposing a mask over a surface of said crystalline substrate;
creating openings in said mask, said openings comprising a plurality of elongated opening sections; and
growing an overgrowth crystalline layer of a second semiconductor material, filling said openings and covering said mask, said second semiconductor material being selected from InP, GaAs and combinations thereof;
wherein,
at least one first section of said elongated opening sections is directed non-parallel relative to at least one second section of said elongated opening sections,
said step of creating comprises creating a plurality of elongated opening sections having a width less than or equal to 500 nm,
said elongated opening sections are crossing linear opening sections,
a longitudinal direction of at least one of said first section and said second section is directed in non-zero angles with respect to both main crystal axes of said surface of said crystalline substrate, and at least one of said non-zero angles with respect to both main crystal axes of said surface of said crystalline substrate and said non-zero angle with respect to all symmetry planes of said surface of said crystalline substrate is larger than 5°.

11. The method according to claim 10, wherein said longitudinal direction of said first section is directed in an angle larger than 5° and less than 85° relative to said longitudinal direction of said second section.

12. The method according to claim 10, comprising the further step of covering said surface of said crystalline substrate with a seed layer before said step of disposing said mask.

13. The method according to claim 10, wherein said step of growing is ended while said overgrowth crystalline layer has a thickness of less than 2 μm above said mask.

14. The method according to claim 10, wherein said elongated opening sections have a width less than or equal to 100 nm.

15. A method for manufacturing of a semiconductor heterostructure, comprising the steps of:

providing a crystalline substrate of a first semiconductor material;

disposing a mask over a surface of said crystalline substrate;

creating openings in said mask, said openings comprising a plurality of elongated opening sections; and growing an overgrowth crystalline layer of a second semiconductor material, filling said openings and covering said mask;

wherein, said second semiconductor material is InP, GaAs or combinations thereof;

at least one first section of said elongated opening sections is directed non-parallel relative to at least one second section of said elongated opening sections;

said step of creating openings comprises creating a plurality of elongated opening sections having a width less than or equal to 500 nm;

said elongated opening sections are curved sections or circular arc sections; and said openings form concentric rings or spirals.

16. The method according to claim 15, comprising the further step of covering said surface of said crystalline substrate with a seed layer before said step of disposing said mask.

17. The method according to claim 15, wherein said step of growing is ended while said overgrowth crystalline layer has a thickness of less than 2 μm above said mask.

18. The method according to claim 15, wherein said elongated opening sections have a width less than or equal to 100 nm.

* * * * *